(12) United States Patent
Deng

(10) Patent No.: US 10,042,011 B2
(45) Date of Patent: Aug. 7, 2018

(54) METHOD TO DETECT OR MONITOR THE DEMAGNETIZATION OF A MAGNET

(71) Applicant: SIEMENS AKTIENGESELLSCHAFT, München (DE)

(72) Inventor: Heng Deng, Ikast (DK)

(73) Assignee: SIEMENS AKTIENGESELLSCHAFT (DE)

( * ) Notice: Subject to any disclaimer, the term of this patent is extended or adjusted under 35 U.S.C. 154(b) by 0 days.

(21) Appl. No.: 15/163,823

(22) Filed: May 25, 2016

(65) Prior Publication Data
US 2017/0030984 A1 Feb. 2, 2017

(30) Foreign Application Priority Data

Jul. 27, 2015 (EP) .................................. 15178453

(51) Int. Cl.
*H02P 21/14* (2016.01)
*G01R 33/16* (2006.01)
(Continued)

(52) U.S. Cl.
CPC ............. *G01R 33/16* (2013.01); *F03D 9/255* (2017.02); *F03D 17/00* (2016.05); *H02M 5/458* (2013.01); *H02P 9/48* (2013.01); *Y02E 10/76* (2013.01)

(58) Field of Classification Search
CPC .. F16C 2361/55; F16C 19/166; F16C 25/083; F16C 39/066; H02K 7/025; H02K 16/00;
(Continued)

(56) References Cited

U.S. PATENT DOCUMENTS 6,700,400 B2 *  3/2004  Atarashi ............. B60L 11/1803
                                                       318/400.01
8,294,289 B2 * 10/2012  Edenfeld ................. H02P 9/006
                                                            290/44
(Continued)

FOREIGN PATENT DOCUMENTS

CN      102023276 A    4/2011
EP       2348619 A1    7/2011
(Continued)

OTHER PUBLICATIONS

Domenico Casadei et al.: "Magnets Faults Characterization for Permanent Magnet Synchronous Motors", 978-1-4244-3441-1, IEEE, 2009.
(Continued)

*Primary Examiner* — Alesa Allgood
(74) *Attorney, Agent, or Firm* — Schmeiser Olsen & Watts LLP

(57) ABSTRACT

A method to detect a decrease of the demagnetization of permanent magnets of the generator of a wind turbine, wherein a frequency converter is able to adapt to the variable frequency of the generator output voltage to the frequency of a power grid, wherein the AC/DC converter or the DC/AC converter of the frequency converter is been disabled, the electrical connections between the generator and the frequency converter are switched on via circuit breakers, the generator speed is determined; the generator output voltage is determined by a voltage sensor which is part of the frequency converter,
the magnetic flux density of the generator is calculated depending on the generator speed and the generator output voltage, a demagnetization event is determined by comparing the resulting flux density value with a predetermined flux density value is provided.

12 Claims, 2 Drawing Sheets

Figure 1:
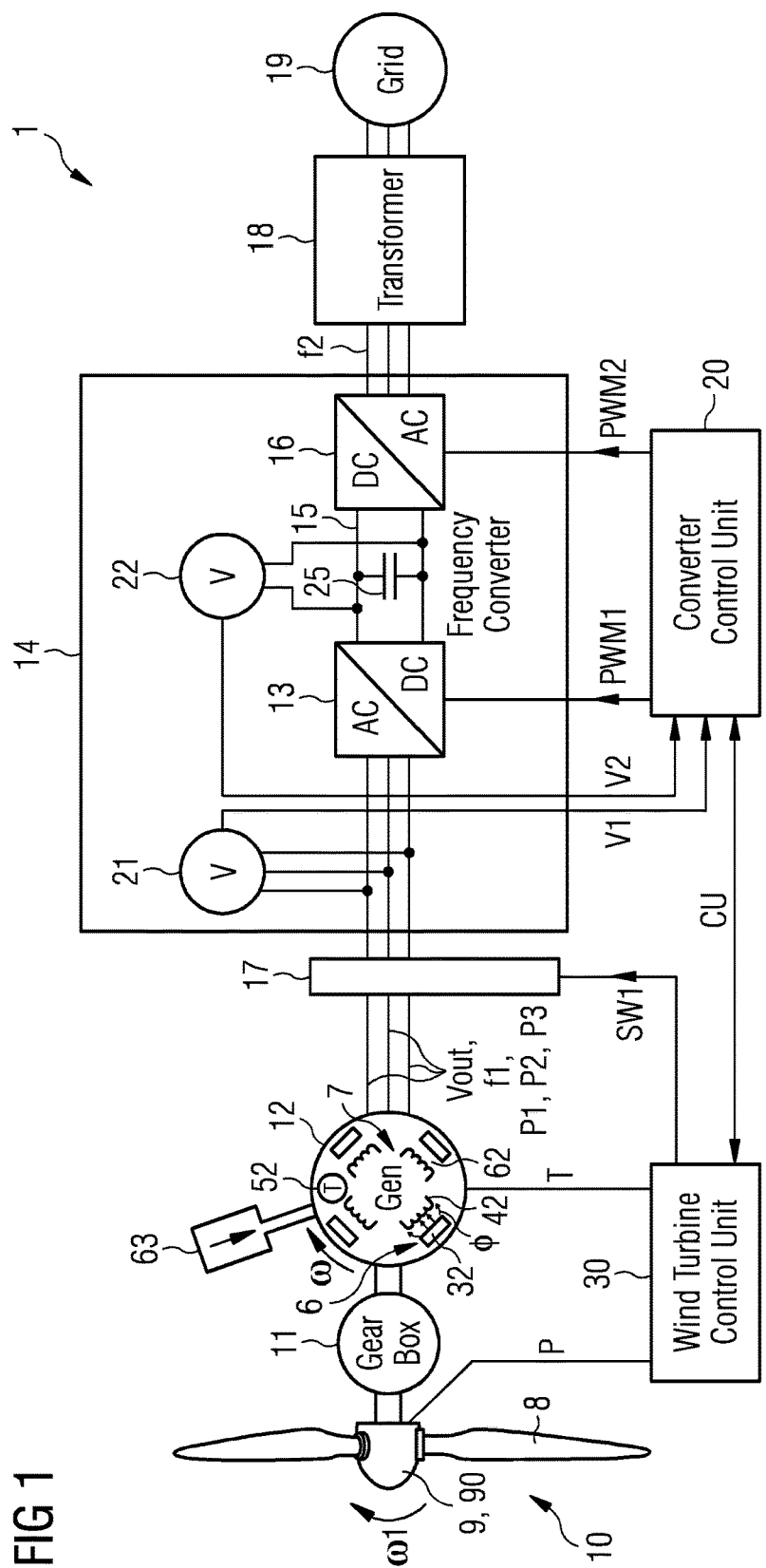

(51) Int. Cl.
*F03D 17/00* (2016.01)
*H02M 5/458* (2006.01)
*H02P 9/48* (2006.01)
*F03D 9/25* (2016.01)

(58) Field of Classification Search
CPC .... H02K 16/02; H02K 19/103; H02K 19/365; H02K 1/24; Y02E 60/16; Y02E 10/725; Y02E 10/723; Y02E 10/763; Y02E 10/72; Y02E 10/721; H02P 2101/15; H02P 29/662; H02P 9/04
See application file for complete search history.

(56) References Cited

U.S. PATENT DOCUMENTS

| | | | |
|---|---|---|---|
| 2002/0113615 A1* | 8/2002 | Atarashi | B60L 11/1803 318/400.01 |
| 2007/0252465 A1 | 11/2007 | Sasaki | |
| 2010/0277137 A1 | 11/2010 | Zhao et al. | |
| 2011/0140424 A1* | 6/2011 | Edenfeld | H02P 9/006 290/44 |
| 2013/0142533 A1 | 6/2013 | Shimizu | |
| 2014/0232306 A1 | 8/2014 | Yasui et al. | |

FOREIGN PATENT DOCUMENTS

| | | |
|---|---|---|
| EP | 2463976 A1 | 6/2012 |
| EP | 2605390 A1 | 6/2013 |
| EP | 2768134 A1 | 8/2014 |
| JP | 2003235286 A | 8/2003 |
| JP | 2006254521 A | 9/2006 |

OTHER PUBLICATIONS

Alstom: "Generator circuit breakers", brochure 2011, www.alstom.com.
Mehmet Akar et al.: "Demagnetization Fault Diagnosis in Permanent Magnet Synchronous Motors", Gaziosmanpasa University, Przeglad Elektrotechniczny, ISSN 0033-2097, R. 89 NR 2a/2013, pp. 229-233, 2013.
Chinese language Office Action for CN Application No. 201610597745.X, dated May 31, 2018.

* cited by examiner

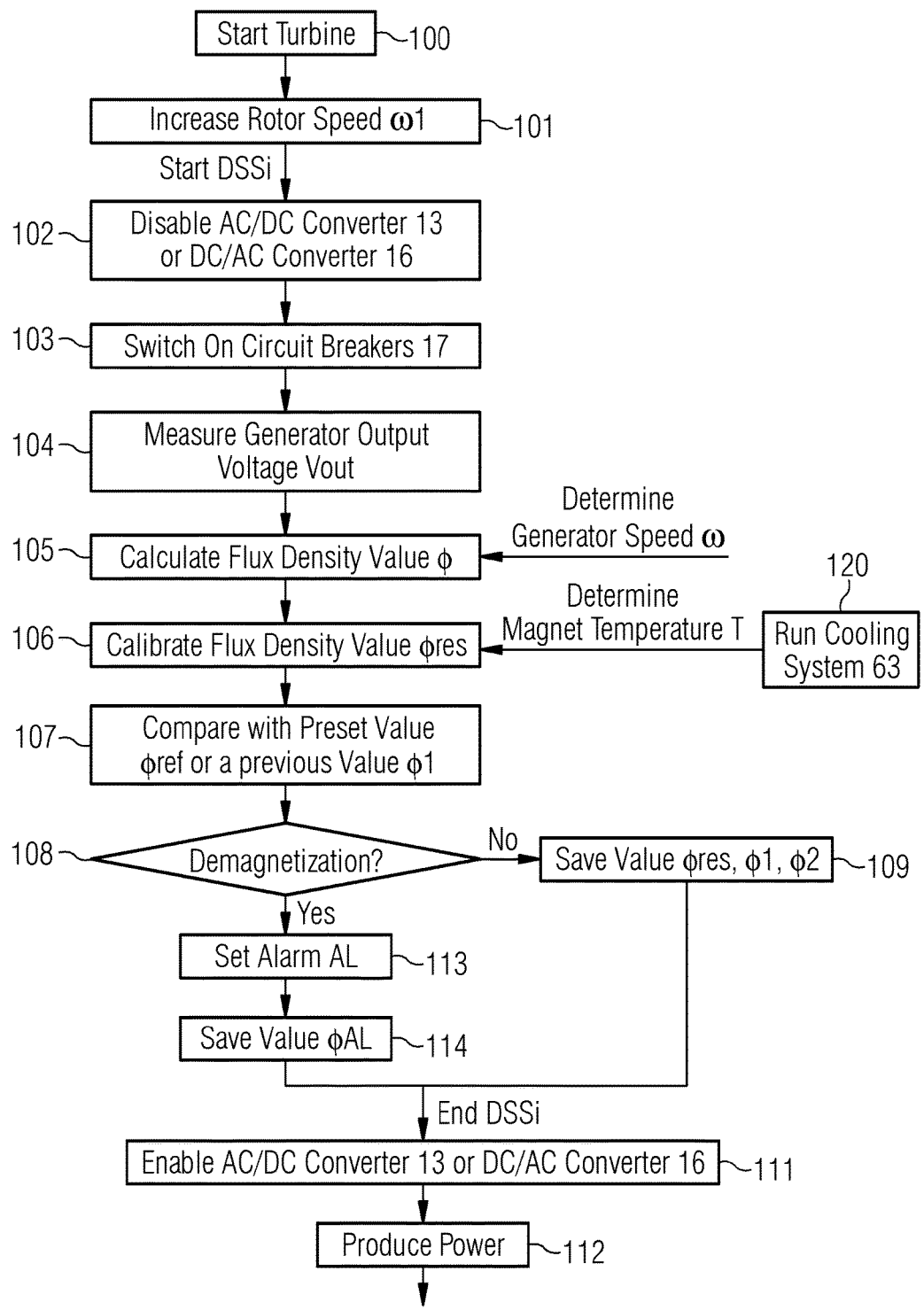

METHOD TO DETECT OR MONITOR THE DEMAGNETIZATION OF A MAGNET

CROSS-REFERENCE TO RELATED APPLICATIONS

This application claims priority to European application No. EP 15178453.5 having a filing date of Jul. 27, 2015, the entire contents of which are hereby incorporated by reference.

FIELD OF TECHNOLOGY

The following relates to a method to detect or monitor the demagnetization of the permanent magnets of the generator of a wind turbine and a respective wind turbine.

BACKGROUND

A modern direct drive wind turbine comprises a permanent magnet generator (PMG) in which the excitation field is provided by permanent magnets instead of a coil. Permanent magnet generators are widely used in wind turbines due to its high efficiency and low weight.

The document "WP131001EN-Generator circuit breakers have special requirements for generator protection" shows an example of circuit breakers which can be used in wind turbine generators.

Document EP 2 605 390 A1 shows a frequency converter which is able to convert the frequency of the output voltage of a wind turbine generator to the rather fixed frequency of a grid. The three-phase output voltage of the generator is being rectified to a DC signal, i.e. converted from AC to DC. The DC signal is then been converted into an output AC voltage signal adapted with a frequency which is adapted to the connected grid.

In modern direct drive permanent magnet wind turbine generators, Nedoymium Iron Boron (NdFeB) magnets are mostly used. The remanent flux density Br of a Nedoymium Iron Boron (NdFeB) is influenced by the ambient temperature. The temperature coefficient a of the remanent flux density Br (also called magnetic output), i.e. how Br varies with temperature, for a NdFeB magnet is typically $-0.12\%/°$ C. from ambient temperature, but a range of $-0.08\%/°$ C. to $-0.12\%/°$ C. is possible depending on the Neodymium content of the magnet.

There are several effects due to elevated temperatures. A reversible loss occurs when the magnetic output/remanent flux density Br falls with rising temperatures but returns as it cools down. As example, a 20° C. rise above ambient temperature with a magnet's typical temperature coefficient of $a=-0.12\%/°$ C. causes a drop in magnetic output of around 20° C.×0.12%/° C.=2.4%, which recovers when the temperature returns down to ambient temperature. An irreversible and just partly recoverable loss occurs when the magnetic output falls with rising temperatures but does not fully return when the magnet cools down.

In wind turbine generators, the generator's magnetic flux is proportional to the remanent flux density Br of the permanent magnets which are able to produce the magnetic flux or the magnetically output. Therefore, a change of the current remanent flux density of the permanent magnets, e.g. due to temperature, or ageing, will result in a respective change in the generator's magnetic flux.

The document "counter electromotive force" (Wikipedia) explains the meaning and the function of the back-electromotive force (back-EMF) of a motor.

The document "Magnets Faults Characterization for Permanent Magnet Synchronous Motors" (Dominico Casadei et al.) shows a method to detect partial demagnetization of permanent magnets in motor applications by measuring harmonic frequencies of the back-EMF voltage.

SUMMARY

An aspect relates to providing a method to detect the demagnetization of the wind turbine magnets in an easy and cost effective way.

In modern direct drive permanent magnet wind turbine generators, Nedoymium Iron Boron (NdFeB) magnets are mostly used. The remanent flux density Br of a Nedoymium Iron Boron (NdFeB) is influenced by the ambient temperature. The temperature coefficient a of the remanent flux density Br (also called magnetic output), i.e. how Br varies with temperature, for a NdFeB magnet is typically $-0.12\%/°$ C. from ambient temperature, but a range of $-0.08\%/°$ C. to $-0.12\%/°$ C. is possible depending on the Neodymium content of the magnet.

There are several effects due to elevated temperatures. A reversible loss occurs when the magnetic output/remanent flux density Br falls with rising temperatures but returns as it cools down. As example, a 20° C. rise above ambient temperature with a magnet's typical temperature coefficient of $a=-0.12\%/°$ C. causes a drop in magnetic output of around 20° C.×0.12%/° C.=2.4%, which recovers when the temperature returns down to ambient temperature. An irreversible and just partly recoverable loss occurs when the magnetic output falls with rising temperatures but does not fully return when the magnet cools down.

In wind turbine generators, the generator's magnetic flux is generated by the permanent magnets and flows through the magnets, the rotor, the stator teeth with the stator coils and the airgap between rotor and stator. The generator's magnetic flux is influenced by various parameters, e.g. the size and geometry of the stator and the rotor of the generator, the size and the positioning of the permanent magnets on the rotor, the material of the stator and rotor elements, the magnetic properties of the permanent magnets, etc.

The term electromotive force, or just EMF, is most commonly used to refer to the voltage that occurs in electric generators where there is relative motion between the armature of the generator and the magnetic field from the generator's permanent magnets, or windings. From Faraday's law, the voltage (EMF voltage) is proportional to the magnetic field, length of the wire/stator windings in the stator armature, and the rotor speed of the generator. This voltage can be measured as the generator output voltage.

In a generator using a stator armature with conductors/coils in the presence of a rotating magnetic flux created by the rotating permanent magnets of the rotor, the stator conductors cut the magnetic field lines as the magnetic field lines rotate. This produces a voltage in the stator coils, which can be measured as the generator output voltage. (Faraday's law of induction.) In case of no electrical load or source are connected to the generator output, i.e. no current flows from or to the generator, the EMF voltage is proportional to the rotational speed of the rotor and the magnetic flux of the generator. Thus, the magnetic flux is determinable by determining the rotational speed of the rotor and determining EMF voltage. The other parameters mentioned above influencing the magnetic flux of the generator are constant in wind turbine operation. Therefore, the magnetic flux and thus indirectly the permanent remanence of the permanent magnets can be determined by determining the rotational speed of the rotor and measuring the EMF voltage, i.e. the generator output voltage in idle mode.

The demagnetization of a permanent magnet results in a permanent reduction of the remanent flux density Br of the permanent magnet. Due to a harsh environment operating conditions of a wind turbine, the generator's permanent magnets can lose their magnetism, i.e. can be demagnetized, due to different reasons. Demagnetization can be caused by a high magnet temperature or by high short circuit currents occurring in the stator windings of a permanent magnet generator in case of generator or electronic converter failure. Ageing of the permanent magnets may also contribute to the demagnetization.

A possible demagnetization of the permanent magnets of the generator can thus be detected by the above mentioned determining of the magnetic flux of the generator which is proportional to the remanent flux density Br of the permanent magnets. The remanent flux density Br of the permanent magnets can be an average value over all single permanent magnets.

The wind turbine generator which executes a method to detect a decrease of the demagnetization of permanent magnets of the generator of a wind turbine comprises
a stator comprising stator windings,
a rotor comprising permanent magnets,
wherein the permanent magnets and the stator windings facing each other in circumferential direction via an air-gap,
wherein the rotation of the rotor in relation to the stator generates the (generator) output voltage of the generator.

The wind turbine further comprises
a frequency converter to adapt the variable frequency of the generator output voltage to the frequency of a power grid being connectable to the output of the frequency converter by a control signal,
the frequency converter comprising a voltage sensor being able to determine the generator output voltage;
the wind turbine further comprising:
generator-sided circuit breakers to switch the electrical connections between the generator and the frequency converter,
a temperature sensor to determine the temperature of the permanent magnets of the generator.

The method to detect the demagnetization comprises the following steps:
disable the AC/DC converter of the frequency converter,
switch on the electrical connections between the generator and the frequency converter,
determine the generator speed,
determine the generator output voltage by the voltage sensor of the frequency converter,
determine the temperature of the permanent magnets of the generator,
calculate the flux density of the generator depending on the generator speed and the generator output voltage,
compensate the temperature dependence of the magnetic flux of the generator,
determine a demagnetization event by comparing the resulting flux density value with a predetermined flux density value.

The DC/AC converter of the frequency converter can be enabled or kept enabled to the power grid during performing the method, e.g. to perform power grid control tasks, e.g. phase control.

Disable the AC/DC converter means either to stop the operation of the AC/DC converter or control the operation in a manner that there will be no power transmission to the subsequent DC bridge, i.e. there will be no current flow.

Enable the AC/DC converter means either to start the operation of the AC/DC converter or to control in a manner that there can be a power transmission to the subsequent DC bridge, i.e. there will be a current flow depending on the wind speed and wind turbine operating conditions.

Disable the DC/AC converter 16 means either to stop the operation of the DC/AC converter 16 or control the operation in a manner that there will be no power transmission to the power grid 19, i.e. there will be no current flow.

Enable the DC/AC converter 16 means either to start the operation of the DC/AC converter 16 or to control in a manner that there can be a power transmission to the power grid 19, i.e. there can be a current flow depending on the wind speed and wind turbine operating conditions.

Preferably, a demagnetization alarm is set if a demagnetization event was determined and wherein the determined flux density value will be saved for further failure treatment.

Preferably, the first resulting flux density value will be stored during a first demagnetization detection sequence.

A respective second resulting flux density value will be stored during a subsequent demagnetization detection sequence, wherein a demagnetization event will be determined by comparing the second resulting flux density value with the first resulting flux density value.

Preferably, the wind turbine starts by setting an appropriate blade pitch angle. The speed of the wind turbine rotor increases at an appropriate wind speed. By disabling or keeping disabled the AC/DC converter of the frequency converter and switching on the circuit breakers, a demagnetization detection sequence starts. After determining a demagnetization event, the demagnetization detection sequence ends. The AC/DC converter of the frequency converter is enabled and the wind turbine starts producing and transmitting power to the grid via the frequency converter, optionally by a transformer adapting the AC voltage to the grid.

Preferably, the cooling system of the wind turbine runs for a predetermined time before determining the temperature of the generator during a demagnetization detection sequence.

Preferably, the magnetic flux of the generator is determined by the relation $$\phi = \omega \cdot V_{out}$$

wherein
$V_{out}$ is the output voltage of the generator when the frequency converter is being disabled, i.e. no current flowing from or to the grid,
$\omega$ is the rotational speed of the generator rotor
$\phi$ is the magnetic flux of the generator,
k is an optional constant considering the generator properties
wherein the resulting magnetic flux is determined by compensating the temperature dependence of the calculated magnetic flux with the relation $$\phi\_result = \phi - \alpha \cdot (T - T_{ref})$$

wherein
T is the temperature of the permanent magnets determined by the temperature sensor (52),
T_ref is a reference temperature, e.g. 20° C. (degree Celsius)
a is the temperature coefficient of the remanent flux density Br of the permanent magnets, e.g. −0.12%/° C.

Preferably, the generator output voltage (Vout) is the generator's EMF (Electromotive Force).

Preferably, the determined generator output voltage is the effective voltage, the peak voltage, the root mean square voltage or the nominal voltage of one or of several phases.

Preferably, the generator output voltage is determined without performing a frequency spectrum analysis. A spectrum analysis requires computing power which can often not been performed by the frequency converter.

Preferably, the control signals controlling the frequency converter are PWM (Pulse Width Modulation) signals or PWM pulses. By the appropriate setting of the control signals, the AC/DC converter of the frequency converter can be disabled ore enabled. The DC/AC converter of the frequency converter is also controlled by the PWM signals. The AC/DC converter can be kept enabled during the demagnetization detection sequence.

Preferably, the generator rotor speed is be determined by analyzing the frequency of the generator output voltage.

Optionally, the generator output voltage is determined indirectly by measuring the voltage of the DC bridge.

Alternatively, the AC/DC converter can be passive, e.g. by using a passive diode bridge. In this case, the AC/DC converter cannot be disabled. Therefore, in the above mentioned method steps, instead of disabling the AC/DC converter, the DC/AC converter will be disabled in case of using a passive AC/DC converter.

The generator output voltage measured by the voltage sensor may be the effective voltage, the peak voltage or the root mean square voltage of one or several phases. Preferably, the generator's base frequency is used for voltage measuring. The generator's base frequency depends on the number of poles of the rotor and the stator. Optionally, the voltage of a higher harmonic order frequency of the base frequency of the generator output voltage can be measured which may require a respective bandpass filter. A spectrum analysis of the generator output voltage is not preferable as it requires a high computing power which usually is not available in a frequency converter's controller.

It has to be noted that embodiments of the invention have been described with reference to different subject matters. In particular, some embodiments have been described with reference to method type claims whereas other embodiments have been described with reference to apparatus type claims. However, a person skilled in the art will gather from the above and the following description that, unless other notified, in addition to any combination of features belonging to one type of subject matter also any combination between features relating to different subject matters, in particular between features of the method type claims and features of the apparatus type claims is considered as to be disclosed with this document.

BRIEF DESCRIPTION

Some of the embodiments will be described in detail, with reference to the following figures, wherein like designations denote like members, wherein:

FIG. 1 shows the components of a variable speed wind turbine necessary to conduct a method to detect the demagnetization of the permanent magnets of the wind turbine generator; and FIG. 2 shows a flow chart comprising a start sequence of a wind turbine including a method to detect the demagnetization of the permanent magnets of a wind turbine shown to FIG. 1.

The illustration in the drawing is schematic. It is noted that in different figures, identical elements or features are provided with the same reference signs. In order to avoid unnecessary repetitions elements or features which have already been elucidated with respect to a previously described embodiment are not elucidated again at a later position of the description.

DETAILED DESCRIPTION

FIG. 1 shows a geared variable speed wind turbine 1. The wind turbine 1 comprises a wind turbine rotor 10 which in operation of the wind turbine 1 is driven by wind. The wind turbine rotor 10 comprises a hub 9 with three blades 8. The hub 9 comprises a pitch control system 90 to control the angle of the blades 8 in order to control the rotational speed ω1 of the wind turbine rotor 10. The wind turbine 1 further comprises an electric generator 12 being driven by the wind turbine rotor 10. In between the wind turbine rotor 10 and the electric generator 12 there is provided a gear box 11. However, it is mentioned that this gear box 11 is an optional component which depending on the specific type of wind turbine 1 may not be necessary, e.g. in case of a direct drive wind turbine. The electric generator 12 is a permanent magnet generator 12. A permanent magnet generator is a generator where the excitation magnetic field is provided by permanent magnets instead by the current flowing through a coil. The generator 12 comprises a rotor 6 with permanent magnets 32 equally positioned circumferentially on the rotor's surface. The generator 10 further comprises a stator 7 with stator coils 42 wounded around stator teeth and facing the magnets 32. There is a small air-gap 62 between the permanent magnets 32 and the stator in circumferential direction. The movement of the permanent magnets 32 in relation to the stator coils 42 results in the electric generator 12 outputting a 3 phase AC power signal Vout. In accordance with the principles of a variable speed wind turbine 1 the frequency of the AC power signal depends on the rotational speed ω of the generator rotor 6. The generator 12 is a multi-pole generator with a high number of permanent magnets 32 and stator coils 42. The generator 12 further comprises at least one temperature sensor 52 to measure or determine the temperature T of the temperature sensitive permanent magnets 32. The information of the temperature T of the permanent magnets 32 is used during the methods to detect the demagnetization of the permanent magnets 32 shown in the next figures.

In order to interface the electric generator 12 with an electric power grid 19, there is provided a frequency converter 14. The frequency converter 14 comprises a generator-side AC/DC converter module 13, a DC bridge 15 with a capacitor 25 and a grid-side DC/AC converter module 16. Both the generator-side AC/DC converter module 13 and the grid-side DC/AC converter module 16 comprise non depicted power electronics switching devices made of PWM-controlled IGBTs (PWM=Pulse Width Modulation) or other devices.

Furthermore, the frequency converter 14 comprises converter voltage sensors 21, 22. The first converter voltage sensor 21 is able to measure the output voltage Vout of AC of the generator with three phases P1, P2, P3. The second voltage sensor 22 is able to measure the voltage Vdc of the DC bridge 15.

A converter control unit 20 controls the operation of the switching devices, (e.g. IGBTs) of the AC/DC converter module 13 via the PWM pulses PWM1 and the DC/AC converter module 16 via the PWM pulses PWM1 in such a manner that by means of the generator-side AC/DC converter module 13 the AC power signal provided by the electric generator 12 is rectified and by means of the grid-side DC/AC converter module the DC power signal is inverted to an AC power signal being fed to the power grid 19. Thereby, the frequency of this AC power signal corresponds to a predefined frequency of the power grid 19.

Disable the AC/DC converter 13 means either to stop the operation of the AC/DC converter 13 or control the operation in a manner that there will be no power transmission to the DC bridge 15, i.e. there will be no current flow.

Enable the AC/DC converter 13 means either to start the operation of the AC/DC converter 13 or to control in a manner that there can occur a power transmission to the DC bridge 15, i.e. there can be a current flow depending on the wind speed and wind turbine operating conditions.

Disable the DC/AC converter 16 means either to stop the operation of the DC/AC converter 16 or control the operation in a manner that there will be no power transmission to the power grid 19, i.e. there will be no current flow.

Enable the DC/AC converter 16 means either to start the operation of the DC/AC converter 16 or to control in a manner that there can occur a power transmission to the power grid 19, i.e. there can be a current flow depending on the wind speed and wind turbine operating conditions.

Alternatively (not shown), the AC/DC converter module 13 comprises a passive rectifier-diode bridge followed by the DC bridge 15 which is cheaper than active IGBT components.

A generator-side circuit breaker 17 is located between the electrical output of the generator 12 and the input of the AC/DC converter module 13 of the frequency converter 14. The circuit breaker 17 is a three-phase switch with the purpose to electrically connect the generator 12 to the frequency converter 14, e.g. during the starting sequence of the wind turbine 1 or to electrically disconnect the generator 12 from the frequency converter 14, e.g. for regular or emergency shut-down of the wind turbine 1. The three phases P1, P2, P3 of the generator 12 can be switched by the circuit breaker 17 independently from each other. Alternatively, the three phases can be switched simultaneously.

A wind turbine control unit 30 controls the operation of the wind turbine, e.g. the operation of the pitch control 90 via pitch signals P, the circuit breakers 17 via switching signals SW1, the converter control unit 20 via the status and control signals CU, the generator 12. The wind turbine control unit 30 uses complex algorithms to control the wind turbine 1 depending on the wind turbine operating conditions, e.g. the temperature signal T of the temperature sensor 52, the wind speed, the status and control signals CU of the converter control unit 20, the voltages V1,V2 transmitted to the converter control unit 20, etc.

As can be seen from FIG. 1, according to the embodiment described here, an optional transformer 18 is provided in order to increase the voltage of the inverted AC power signal such that this voltage corresponds to the operating voltage of the power grid 19.

FIG. 2 shows a flow chart of a method to detect a demagnetization of permanent magnets 32 of the generator 12 of a wind turbine 1, the generator which can be conducted in a wind turbine 1 disclosed in FIG. 1.

The flow chart comprises the following steps:

The wind turbine 1 starts by setting an appropriate blade pitch angle adapted to the wind speed (Step 100). The speed ω1 of the wind turbine rotor 10 increases depending on the current wind speed (Step 101) resulting in a generator speed ω depending on the transmission factor of the gear box 11. Now, the demagnetization detection sequence DSSi starts.

The AC/DC converter 13 of the frequency converter 14 will be disabled or kept disabled (Step 102).

The generator-sided circuit breakers 17 will be switched on (Step 103) to connect the three phase AC generator output voltage Vout to the frequency converter 14.

The generator output voltage Vout will be determined by the voltage sensor 21 the frequency converter 14 comprises (Step 104). By using the voltage sensor 21 integrated into the frequency converter 14 and used to control the frequency converter 14, it is not necessary to install a separate voltage sensor.

The generator speed ω will be determined and used to calculate the flux density value φ (Step 105). The generator speed ω can be determined by using a sensor or by analyzing the frequency f of the generator output voltage Vout.

The magnetic flux density φ of the generator 12 will be determined depending on the generator speed ω and the generator output voltage Vout.

The magnetic flux φ of the generator will be determined by the relation $$\phi = \omega \cdot Vout$$

wherein
Vout is the output voltage of the generator when the frequency converter is being disabled so that there will be no current flowing.
ω is the rotational speed of the generator rotor
φ is the magnetic flux of the generator, The temperature T of the permanent magnets 32 of the generator 12 will be determined, e.g. by one or several temperature sensors 52 distributed and located in the vicinity of the permanent magnets 52. Alternatively, the average temperature of the cooling fluid will be used to determine the temperature of the permanent magnets 32.

The flux density value φ will be calibrated in order to compensate the temperature dependence of the magnetic flux density φ of the generator due to the temperature dependency of the permanent remanence Br of the permanent magnets 32 (Step 106).

The magnetic flux φ_result resulting from the calibration is determined by compensating the temperature dependence of the determined magnetic flux φ with the relation $$\phi\_result = \phi - \alpha \cdot (T - Tref)$$

wherein
T is the temperature of the permanent magnets determined by the temperature sensor 52,
T_ref is a reference temperature, typically 20° C. (degrees Celsius),
a is the temperature coefficient of the remanent flux density Br of the permanent magnets 32 which is typically −0.12%/° C. for NdFeB permanent magnets.

A demagnetization event will be determined by comparing the resulting flux density value φres with a predetermined flux density value φref or a previously measured flux density value φ1.

If the difference between the resulting flux density value φres and the predetermined flux density value φref or the previously measured flux density value φ1 is below a predetermined value, no demagnetization occurred and the current resulting flux density value φres will be saved as new value φ1 which will be used in the next demagnetization detection sequence as previously measured flux density value φ1 (Step 109).

If the difference between the resulting flux density value φres and the predetermined flux density value φref or the previously measured flux density value φ1 is above a predetermined value, a demagnetization of the permanent magnets 32 occurred and a demagnetization alarm signal AL is given out (Step 113) and the current resulting flux density value φres is stored as fault flux density value φAL for further failure treatment (Step 114).

After determining a demagnetization event, the demagnetization detection sequence DSSi ends. The AC/DC converter 13 of the frequency converter 14 will be enabled so that the frequency converter 14 fully operates: The wind turbine 1 starts producing and transmitting electrical power to the grid 19 via the fully operating frequency converter 14, optionally by a transformer adapting the AC output voltage of the frequency converter 14 to the power grid 19 (Step 112). Preferably, the DC/AC converter 16 is enabled and connected to the power grid 19 during the demagnetization detection sequence DSSi. Thus, the frequency converter 14 can execute power grid control tasks, e.g. a phase control of the grid.

The demagnetization detection sequence DSSi is defined as a demagnetization detection or monitoring sequence.

Alternatively, the steps 107 to 109 comprise the steps:
store a first resulting flux density value φ1 during a first demagnetization detection sequence DDS1,
store a second resulting flux density value φ2 during a subsequent demagnetization detection sequence DSS2,
determine a demagnetization event by comparing the second resulting flux density value φ2 with the first resulting flux density value φ1.

In an alternative embodiment (Step 120), the cooling system 63 of the wind turbine 1 runs for a predetermined time before determining the temperature T of the permanent magnets 32 of the generator 12 for the demagnetization detection.

The generator output voltage Vout is the generator's EMF voltage (Electromotive Force).

The determined generator output voltage Vout can be the effective voltage Veff, the peak voltage Vpeak, the root mean square voltage Vrms or the nominal voltage Vnom of one or of several phases P1, P2, P3.

Alternatively, the generator output voltage Vout can be determined indirectly by measuring the voltage of the DC bridge 15.

The generator output voltage Vout is preferably determined without performing a frequency spectrum analysis which would require a high computing power of the frequency converter.

The control signals PWM1, PWM2 control the AC/DC converter 13 and the DC/AC converter 16 of the frequency converter 14 which are preferably PWM signals or pulses (Pulse Width Modulation).

In a further embodiment, the AC/DC converter can be passive, e.g. by using a passive diode bridge (not shown in FIG. 1), which is non-controllable by control signals PWMi. In this case, the AC/DC converter cannot be disabled. Thus, instead of disabling the AC/DC converter 13 in step 102, the DC/AC converter 16 will be disabled in case of the AC/DC converter being passive. Respectively, in step 111, the AC/DC converter 16 will be enabled in step 106 (not shown in FIG. 2).

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A method to detect or monitor the demagnetization of the permanent magnets of a generator of a wind turbine, the generator including:
   a stator having stator windings,
   a rotor having permanent magnets, wherein the permanent magnets and the stator windings facing each other in circumferential direction via an air-gap, wherein the rotation of the rotor in relation to the stator generates a generator output voltage of the generator;
the wind turbine further including:
   a frequency converter to adapt a variable frequency of the generator output voltage to a frequency of a power grid being connectable or connected to the output of the frequency converter,
   the frequency converter comprising a voltage sensor being able to determine the generator output voltage;
the wind turbine further including:
   circuit breakers to switch electrical connections between the generator and the frequency converter,
   a temperature sensor to determine the temperature of the permanent magnets of the generator;
the method comprising the steps:
   disable an AC/DC converter of the frequency converter,
   switch on the electrical connections between the generator and the frequency converter, determine the generator speed by using a sensor or by analyzing the frequency of the generator output voltage;
   determine the generator output voltage by the voltage sensor of the frequency converter, determine the temperature of the permanent magnets of the generator,
   calculate the magnetic flux density of the generator depending on the generator speed and the generator output voltage,
   calibrate in order to compensate the temperature dependence of the magnetic flux density of the generator with a relation $\phi$ result=$\phi$−a·(T−Tref), a wherein
   T is the temperature of the permanent magnets determined by the temperature sensor,
   T_ref is a reference temperature,
   a is the temperature coefficient of the remanent flux density (Br) of the permanent magnets, determine a demagnetization event by comparing the resulting flux density value with a predetermined flux density value.

2. The method according to claim 1, wherein the steps are defined as a demagnetization detection sequence, comprising the steps:
   storing a first resulting flux density value during a first demagnetization detection sequence,
   storing a second resulting flux density value during a subsequent demagnetization detection sequence, and
   determining a demagnetization event by comparing the second resulting flux density value with the first resulting flux density value.

3. The method according to claim 1, further comprising the step:
   run a cooling system of the wind turbine for a predetermined time before determining the temperature of the permanent magnets of the generator for the demagnetization detection.

4. The method according to claim 1, wherein the magnetic flux of the generator is determined by the relation $\phi = \omega \cdot Vout$ wherein
   Vout is the output voltage of the generator when the frequency converter is being disabled so that no current flow occurs,
   $\omega$ is the rotational speed of the generator rotor,
   $\phi$ is the magnetic flux of the generator, k is an optional constant considering the generator properties wherein the resulting magnetic flux (ϕ_result) is determined by compensating the temperature dependence of the determined magnetic flux (ϕ) with the relation ϕ_result=ϕ−a·(T−Tref) wherein T is the temperature of the permanent magnets determined by the temperature sensor, T_ref is a reference temperature, a is the temperature coefficient of the remanent flux density (Br) of the permanent magnets.

5. The method according to claim 1, wherein the generator output voltage is the generator's EMF voltage.

6. The method according to claim 1, wherein the determined generator output voltage is the effective voltage, the peak voltage, the root mean square voltage or the nominal voltage of one or of several phases.

7. The method according to claim 1, wherein the generator output voltage is determined indirectly by measuring the voltage of a DC bridge.

8. The method according to claim 1, wherein the generator output voltage is determined without performing a frequency spectrum analysis.

9. The method according to claim 1, wherein a generator rotor speed is determined by analyzing the frequency of the generator output voltage.

10. A wind turbine executing the method according to claim 1.

11. The method according to claim 1, further comprising the following first steps of a wind turbine operation:
    starting the wind turbine,
    increasing the speed of the rotor, the method further comprising as one of the last steps setting control signals controlling the frequency converter to enable the AC/DC converter.

12. The method according to claim 11, wherein: the control signals controlling the frequency converter of the AC/DC converter or a DC/AC converter, are PWM signals or pulses.

* * * * *

UNITED STATES PATENT AND TRADEMARK OFFICE
CERTIFICATE OF CORRECTION

| | |
|---|---|
| PATENT NO. | : 10,042,011 B2 |
| APPLICATION NO. | : 15/163823 |
| DATED | : August 7, 2018 |
| INVENTOR(S) | : Heng Deng |

Page 1 of 1

It is certified that error appears in the above-identified patent and that said Letters Patent is hereby corrected as shown below:

In the Claims

Column 10, Line 36, please change "a relation $\phi\_result = \phi - a \cdot (T - Tref)$, a wherein" to -- a relation $\phi\_result = \phi - a \cdot (T - Tref)$, wherein --

Signed and Sealed this
Eleventh Day of December, 2018

Andrei Iancu
*Director of the United States Patent and Trademark Office*